US012701728B2

(12) United States Patent
Lin et al.

(10) Patent No.: US 12,701,728 B2
(45) Date of Patent: Aug. 4, 2026

(54) SEMICONDUCTOR STRUCTURE INCLUDING SCHOTTKY BARRIER DIODE AND MANUFACTURING METHOD THEREOF

(71) Applicant: United Microelectronics Corp., Hsinchu (TW)

(72) Inventors: Wen-Kai Lin, Tainan City (TW); Sheng-Yuan Hsueh, Tainan City (TW); Kuo-Hsing Lee, Hsinchu County (TW); Chih-Kai Kang, Tainan City (TW)

(73) Assignee: United Microelectronics Corp., Hsinchu (TW)

( * ) Notice: Subject to any disclaimer, the term of this patent is extended or adjusted under 35 U.S.C. 154(b) by 372 days.

(21) Appl. No.: 18/487,110

(22) Filed: Oct. 15, 2023

(65) Prior Publication Data

US 2025/0089281 A1     Mar. 13, 2025

(30) Foreign Application Priority Data

Sep. 11, 2023    (TW) ................................. 112134483

(51) Int. Cl.
*H10D 8/60*        (2025.01)
*H10D 8/01*        (2025.01)
*H10D 64/01*        (2025.01)
*H10D 64/64*        (2025.01)

(52) U.S. Cl.
CPC .............. *H10D 8/60* (2025.01); *H10D 8/051* (2025.01); *H10D 64/01* (2025.01); *H10D 64/64* (2025.01)

(58) Field of Classification Search
CPC .......... H10D 8/60; H10D 64/01; H10D 8/051; H10D 64/64
See application file for complete search history.

(56) References Cited

U.S. PATENT DOCUMENTS

| | | | |
|---|---|---|---|
| 8,143,690 B2 | 3/2012 | Park et al. | |
| 8,486,587 B2 | 7/2013 | Tsai et al. | |
| 9,275,933 B2 | 3/2016 | Kuo et al. | |
| 9,748,139 B1 | 8/2017 | Liou et al. | |
| 9,761,791 B2 | 9/2017 | Shiu et al. | |
| 10,090,465 B2 | 10/2018 | Hsu et al. | |
| 10,964,687 B2 | 3/2021 | Lee et al. | |
| 11,342,232 B2 | 5/2022 | Dasgupta et al. | |
| 11,373,995 B2 | 6/2022 | Gossner et al. | |
| 11,545,586 B2 | 1/2023 | Gossner et al. | |
| 2017/0352653 A1* | 12/2017 | Li ...................... | H10D 62/8325 |
| 2020/0381516 A1* | 12/2020 | Zhaomeng ........ | H01L 21/76834 |

* cited by examiner

*Primary Examiner* — Afroza Chowdhury
(74) *Attorney, Agent, or Firm* — JCIPRNET

(57)            ABSTRACT

Provided are a semiconductor structure and a manufacturing method thereof. The semiconductor structure includes a substrate including a fin portion, first and second doped regions having a first conductive type, first and second contacts, and first and second metal silicide layers. The fin portion protrudes from a surface of the substrate. The first doped region is disposed in the fin portion. The second doped region is disposed in the fin portion and connected to the first doped region. A doping concentration of the second doped region is greater than that of the first doped region. The first contact is disposed on the first doped region. The second contact is disposed on the second doped region. The first metal silicide layer is disposed between the first contact and the first doped region. The second metal silicide layer is disposed between the second contact and the second doped region.

22 Claims, 9 Drawing Sheets

SEMICONDUCTOR STRUCTURE INCLUDING SCHOTTKY BARRIER DIODE AND MANUFACTURING METHOD THEREOF

CROSS-REFERENCE TO RELATED APPLICATION

This application claims the priority benefit of Taiwan application serial no. 112134483, filed on Sep. 11, 2023. The entirety of the above-mentioned patent application is hereby incorporated by reference herein and made a part of this specification.

BACKGROUND

Technical Field

The present invention relates to a semiconductor structure, and in particular to a semiconductor structure including a Schottky barrier diode (SBD).

Description of Related Art

A Schottky barrier diode is a device composed of a semiconductor and a metal. Due to lower forward voltage and shorter reverse recovery time, the Schottky barrier diode is suitable for the high-speed switching application. In addition, the Schottky energy barrier diode has the characteristic of low leakage current.

At one end of the Schottky barrier diode, the doped region in the substrate and the metal silicide layer disposed on the doped region may form a Schottky junction at the anode. At the other end of the Schottky barrier diode, the doped region in the substrate and the metal silicide layer disposed on the doped region may form an ohmic junction at the cathode. In addition, the metal silicide layer located at the anode and the metal silicide layer located at the cathode are separated from each other by an isolation layer, such as an oxide layer, disposed on the substrate.

However, since the metal silicide layer located at the anode and the metal silicide layer located at the cathode are separated by the isolation layer, the Schottky barrier diode has a larger layout area and cannot meet the requirement of dimension reduction. In addition, due to the isolation layer, the distance between the metal silicide layer located at the anode and the metal silicide layer located at the cathode is too large, causing the resistance of the Schottky barrier diode to be too high and affecting the performance.

SUMMARY

The present invention provides a semiconductor structure in which the Schottky barrier diode is disposed at the fin portion of the substrate.

The present invention provides a manufacturing method of a semiconductor structure, in which the Schottky barrier diode is formed at the fin portion of the substrate.

The semiconductor structure of the present invention includes a substrate including a fin portion, first and second doped regions having a first conductive type, first and second contacts, and first and second metal silicide layers. The fin portion protrudes from a surface of the substrate. The first doped region is disposed in the fin portion. The second doped region is disposed in the fin portion and connected to the first doped region. A doping concentration of the second doped region is greater than that of the first doped region.

The first contact is disposed on the first doped region. The second contact is disposed on the second doped region. The first metal silicide layer is disposed between the first contact and the first doped region. The second metal silicide layer is disposed between the second contact and the second doped region.

In an embodiment of the semiconductor structure of the present invention, the doping concentration of the first doped region is ranged from $1\times10^{18}$ cm$^{-3}$ to $1\times10^{19}$ cm$^{-3}$.

In an embodiment of the semiconductor structure of the present invention, the doping concentration of the second doped region is ranged from $1\times10^{20}$ cm$^{-3}$ and $5\times10^{20}$ cm$^{-3}$.

In an embodiment of the semiconductor structure of the present invention, the fin portion has a second conductive type.

In an embodiment of the semiconductor structure of the present invention, the semiconductor structure further includes a third doped region having the first conductive type, wherein the third doped region is disposed below the first doped region, and a doping concentration of the third doped region is between the doping concentration of the first doped region and the doping concentration of the second doped region.

In an embodiment of the semiconductor structure of the present invention, the doping concentration of the third doped region is ranged from $1\times10^{19}$ cm$^{-3}$ and $1\times10^{20}$ cm$^{-3}$.

In an embodiment of the semiconductor structure of the present invention, a depth of the third doped region is smaller than a depth of the second doped region.

In an embodiment of the semiconductor structure of the present invention, the first contact extends into the first doped region.

In an embodiment of the semiconductor structure of the present invention, the first doped region is located throughout the fin portion, and the second doped region is located in the first doped region.

In an embodiment of the semiconductor structure of the present invention, the first contact includes a first portion and a second portion connected to each other, the first portion is located on a top surface of the fin portion, the second portion extends downward along a sidewall of the fin portion, and the first metal silicide layer is located between the first contact and the top surface and the sidewall of the fin portion.

The manufacturing method of the semiconductor structure of the present invention includes the following steps. A substrate including a fin portion protruding from a surface of the substrate is provided. A first doped region having a first conductive type is formed in the fin portion. A second doped region having the first conductive type is formed in the fin portion, wherein the second doped region is connected to the first doped region, and a doping concentration of the second doped region is greater than a doping concentration of the first doped region. A first contact is formed on the first doped region. A second contact is formed on the second doped region. A first metal silicide layer is formed between the first contact and the first doped region. A second metal silicide layer is formed between the second contact and the second doped region.

In an embodiment of the manufacturing method of the semiconductor structure of the present invention, the doping concentration of the first doped region is ranged from $1\times10^{18}$ cm$^{-3}$ to $1\times10^{19}$ cm$^{-3}$.

In an embodiment of the manufacturing method of the semiconductor structure of the present invention, the doping concentration of the second doped region is ranged from $1\times10^{20}$ cm$^{-3}$ to $5\times10^{20}$ cm$^{-3}$.

In an embodiment of the manufacturing method of the semiconductor structure of the present invention, the fin portion has a second conductive type.

In an embodiment of the manufacturing method of the semiconductor structure of the present invention, the manufacturing method further includes the following step. A third doped region having the first conductive type is formed below the first doped region, wherein a doping concentration of the third doped region is between the doping concentration of the first doped region and the doping concentration of the second doped region.

In an embodiment of the manufacturing method of the semiconductor structure of the present invention, the doping concentration of the third doped region is ranged from $1\times10^{19}$ cm$^{-3}$ to $1\times10^{20}$ cm$^{-3}$.

In an embodiment of the manufacturing method of the semiconductor structure of the present invention, a depth of the third doped region is smaller than a depth of the second doped region.

In an embodiment of the manufacturing method of the semiconductor structure of the present invention, the first contact extends into the first doped region.

In an embodiment of the manufacturing method of the semiconductor structure of the present invention, a forming method of the first contact, the second contact, the first metal silicide layer and the second metal silicide layer includes the following steps. A dielectric layer is formed on the substrate, wherein the dielectric layer covers the fin portion. A first contact hole exposing a part of the first doped region is formed in the dielectric layer. A second contact hole exposing a part of the second doped region is formed in the dielectric layer. The first metal silicide layer is formed on the first doped region exposed by the first contact hole. The second metal silicide layer is formed on the second doped region exposed by the second contact hole. A conductive material is formed on the first metal silicide layer and the second metal silicide layer.

In an embodiment of the manufacturing method of the semiconductor structure of the present invention, the first doped region is formed throughout the fin portion, and the second doped region is formed in the first doped region.

In an embodiment of the manufacturing method of the semiconductor structure of the present invention, the first contact includes a first portion and a second portion connected to each other, the first portion is located on a top surface of the fin portion, the second portion extends downward along a sidewall of the fin portion, and the first metal silicide layer is formed between the first contact and the top surface and the sidewall of the fin portion.

In an embodiment of the manufacturing method of the semiconductor structure of the present invention, a forming method of the first contact, the second contact, the first metal silicide layer and the second metal silicide layer includes the following steps. A dielectric layer is formed on the substrate, wherein the dielectric layer covers the fin portion. A first contact hole exposing a part of the top surface and a part of the sidewall of the fin portion is formed in the dielectric layer. A second contact hole exposing a part of the second doped region is formed in the dielectric layer. The first metal silicide layer is formed on the fin portion exposed by the first contact hole. The second metal silicide layer is formed on the second doped region exposed by the second contact hole. A conductive material is formed on the first metal silicide layer and the second metal silicide layer.

Based on the above, in the semiconductor structure of the present invention, the first doped region and the first metal silicide layer constitute the Schottky junction of the Schottky barrier diode, the second doped region and the second metal silicide layer constitute the ohmic junction of the Schottky barrier diode, and the Schottky barrier diode is disposed at the fin portion of the substrate, so that the Schottky barrier diode may have a smaller layout area.

In addition, in the semiconductor structure of the present invention, the first metal silicide layer is formed in the first contact hole and the second metal silicide layer is formed in the second contact hole, so the first metal silicide layer and the second metal silicide layer may be separated from each other without an additional isolation layer. In this way, the distance between the first metal silicide layer and the second metal silicide layer may be effectively reduced, so that the Schottky barrier diode may have lower resistance.

DESCRIPTION OF THE EMBODIMENTS

The embodiments are listed below and described in detail with the accompanying drawings, but the provided embodiments are not intended to limit the scope of the present invention. In addition, the drawings are for illustration purposes only and are not drawn to original scale. In order to facilitate understanding, the same devices will be described with the same symbols in the following descriptions.

In the text, the terms mentioned in the text, such as "comprising", "including", "containing" and "having" are all open-ended terms, i.e., meaning "including but not limited to".

When using terms such as "first" and "second" to describe elements, it is only used to distinguish the elements from each other, and does not limit the order or importance of the devices. Therefore, in some cases, the first element may also be called the second element, the second element may also be called the first element, and this is not beyond the scope of the present invention.

In addition, the directional terms, such as "on", "above", "under" and "below" mentioned in the text are only used to refer to the direction of the drawings, and are not used to limit the present invention.

Also, herein, a range expressed by "one value to another value" is a general representation to avoid enumerating all values in the range in the specification. Thus, the recitation of a particular numerical range encompasses any numerical value within that numerical range, as well as smaller numerical ranges bounded by any numerical value within that numerical range.

The semiconductor structure of the embodiment of the present invention includes a Schottky barrier diode disposed at a fin portion of a substrate, and each of a metal silicide layer located at the anode of the Schottky barrier diode and a metal silicide layer located at the cathode of the Schottky barrier diode is located only between a contact and the fin portion. In this way, there may be a shorter distance between the metal silicide layer located at the anode and the metal silicide layer located at the cathode, so that the Schottky barrier diode may have a lower resistance. The semiconductor structure of the embodiment of the present invention will be further explained below.

FIGS. 1A to 1D are schematic cross-sectional views of the manufacturing process of the semiconductor structure of the first embodiment of the present invention. In the present embodiment, the conductivity types include the P-type and the N-type. In addition, depending on actual needs, in other embodiments, the P type in the present embodiment may be replaced by the N type, and the N type in the present embodiment may be replaced by the P type.

Figure 1A:
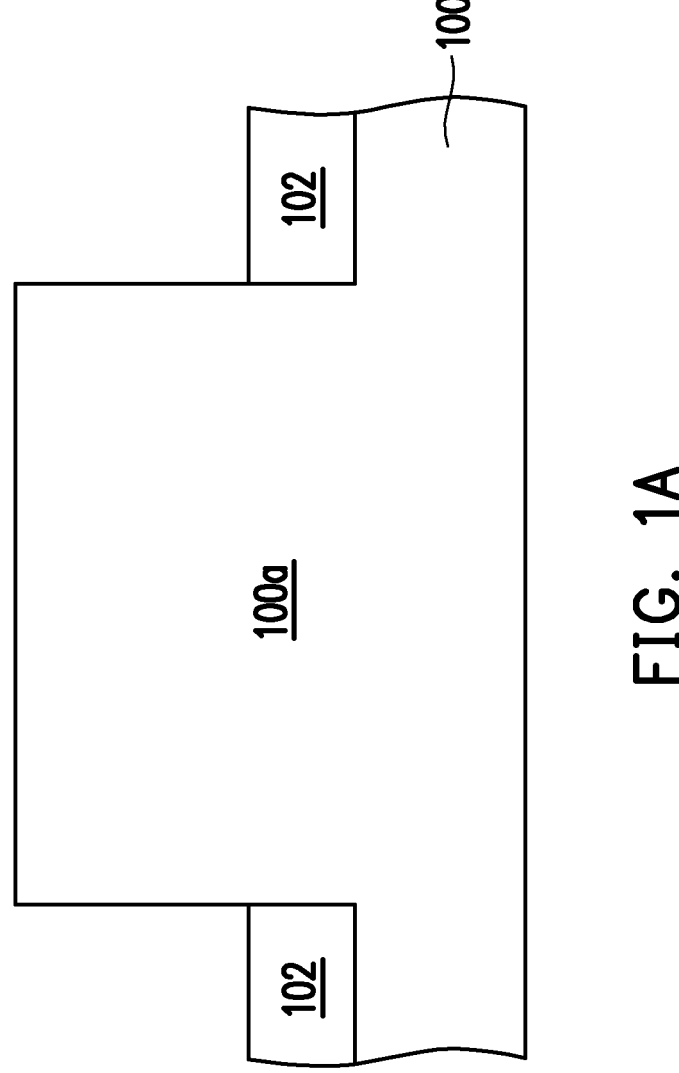
FIGS. 1A to 1D are schematic cross-sectional views of the manufacturing process of the semiconductor structure of the first embodiment of the present invention.

Referring to FIG. 1A, a substrate 100 is provided. In the present embodiment, the substrate 100 is silicon substrate. Next, a patterning process is performed on the substrate 100 to remove a part of the substrate 100, so that the substrate 100 has a fin portion 100a protruding from a surface thereof. Then, an ion implantation process may be performed to form a well region at least in the fin portion 100a. In the present embodiment, a P-type well region is formed throughout the fin portion 100a, but the present invention is not limited thereto. After that, an isolation layer 102 is formed on the substrate 100. In the present embodiment, the isolation layer 102 surrounds the fin portion 100a, and the top surface of the isolation layer 102 is lower than the top surface of the fin portion 100a. In the present embodiment, the isolation layer 102 is an oxide layer, but the present invention is not limited thereto.

Figure 1B:
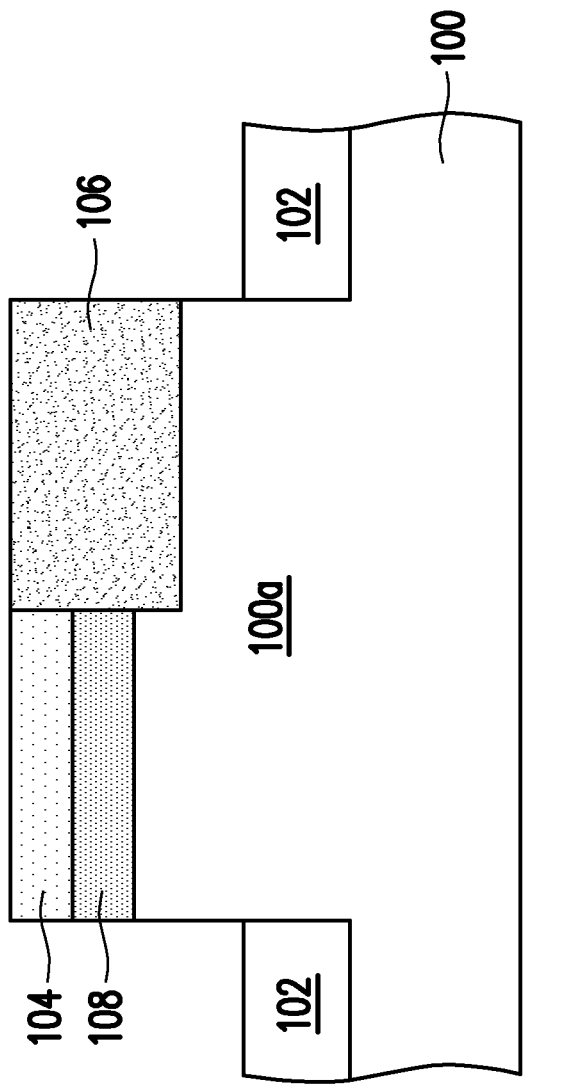

Referring to FIG. 1B, an ion implantation process is performed to implant dopants into the fin portion 100a to form a first doped region 104 and a second doped region 106 in the fin portion 100a. In the present embodiment, the first doped region 104 and the second doped region 106 are N-type doped regions. The first doped region 104 and the second doped region 106 are formed at the top surface of the fin portion 100a, and the first doped region 104 and the second doped region 106 are connected with each other. The depth of the first doped region 104 is smaller than the depth of the second doped region 106. The doping concentration of the second doped region 106 is greater than the doping concentration of the first doped region 104. In the present embodiment, the doping concentration of the first doped region 104 may be ranged from $1 \times 10^{18}$ cm$^{-3}$ to $1 \times 10^{19}$ cm$^{-3}$, and the doping concentration of the second doped region 106 may be ranged from $1 \times 10^{20}$ cm$^{-3}$ to $5 \times 10^{20}$ cm$^{-3}$.

In addition, in the above ion implantation process, a third doped region 108 may also be formed below the first doped region 104. The third doped region 108 is an N-type doped region. The third doped region 108 is connected to the first doped region 104 and the second doped region 106. The depth of the third doped region 108 is smaller than the depth of the second doped region 106. The doping concentration of the third doped region 108 is between the doping concentration of the first doped region 104 and the doping concentration of the second doped region 106. In the present embodiment, the doping concentration of the third doped region 108 may be ranged from $1 \times 10^{19}$ cm$^{-3}$ to $1 \times 10^{20}$ cm$^{-3}$.

Figure 1C:
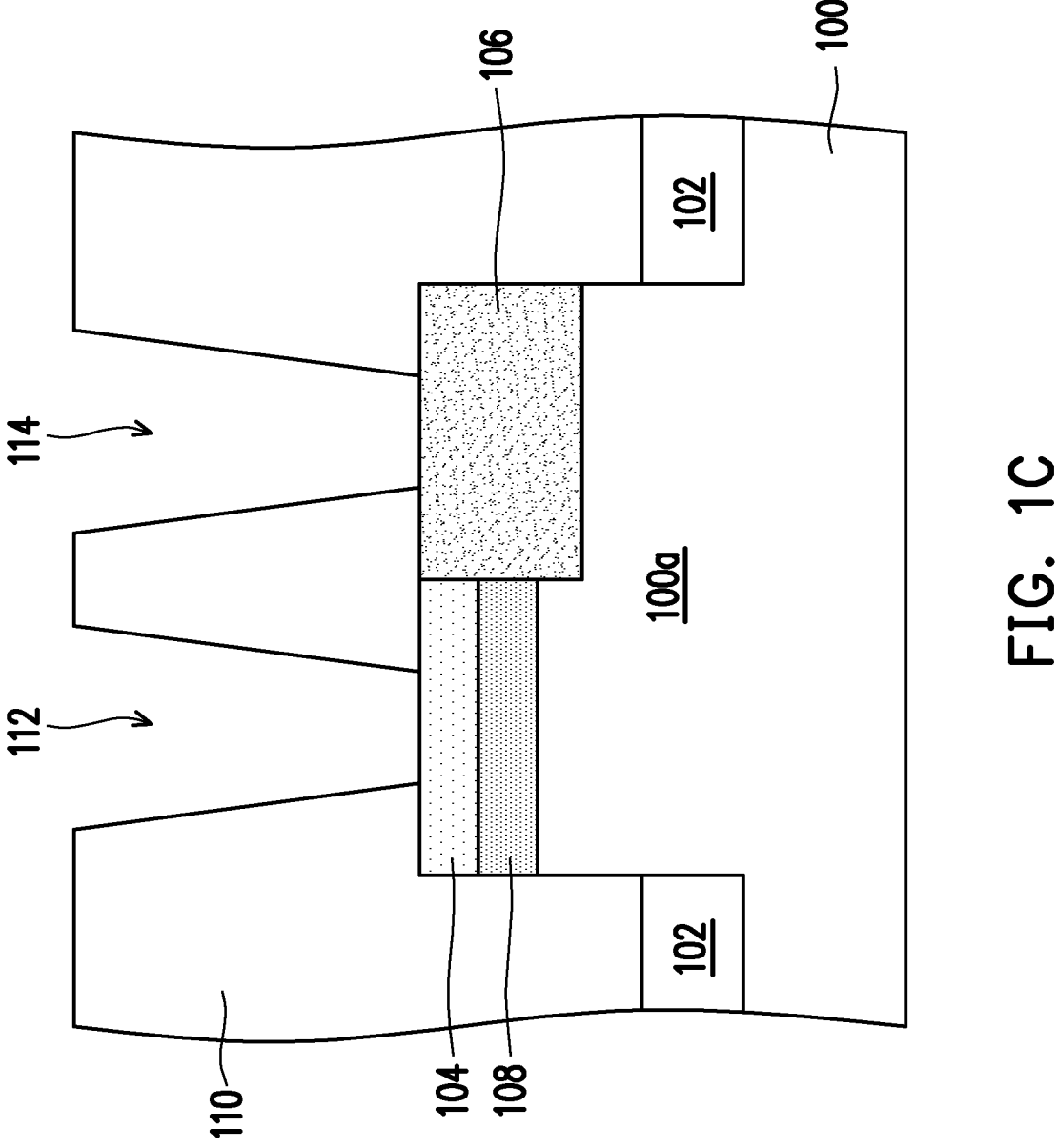

Referring to FIG. 1C, a dielectric layer 110 is formed on the substrate 100. The dielectric layer 110 covers the fin portion 100a and the isolation layer 102. In the present embodiment, the dielectric layer 110 is an oxide layer. The dielectric layer 110 is served as an inter-layer dielectric (ILD) layer. Next, a first contact hole 112 exposing a part of the first doped region 104 and a second contact hole 114 exposing a part of the second doped region 106 are formed in the dielectric layer 110. The first contact hole 112 and the second contact hole 114 may be formed in the same process step, but the present invention is not limited thereto. In the present embodiment, the bottoms of the first contact hole 112 and the second contact hole 114 are located on the top surface of the fin portion 100a. That is, the first contact hole 112 and the second contact hole 114 have the same depth.

Figure 1D:
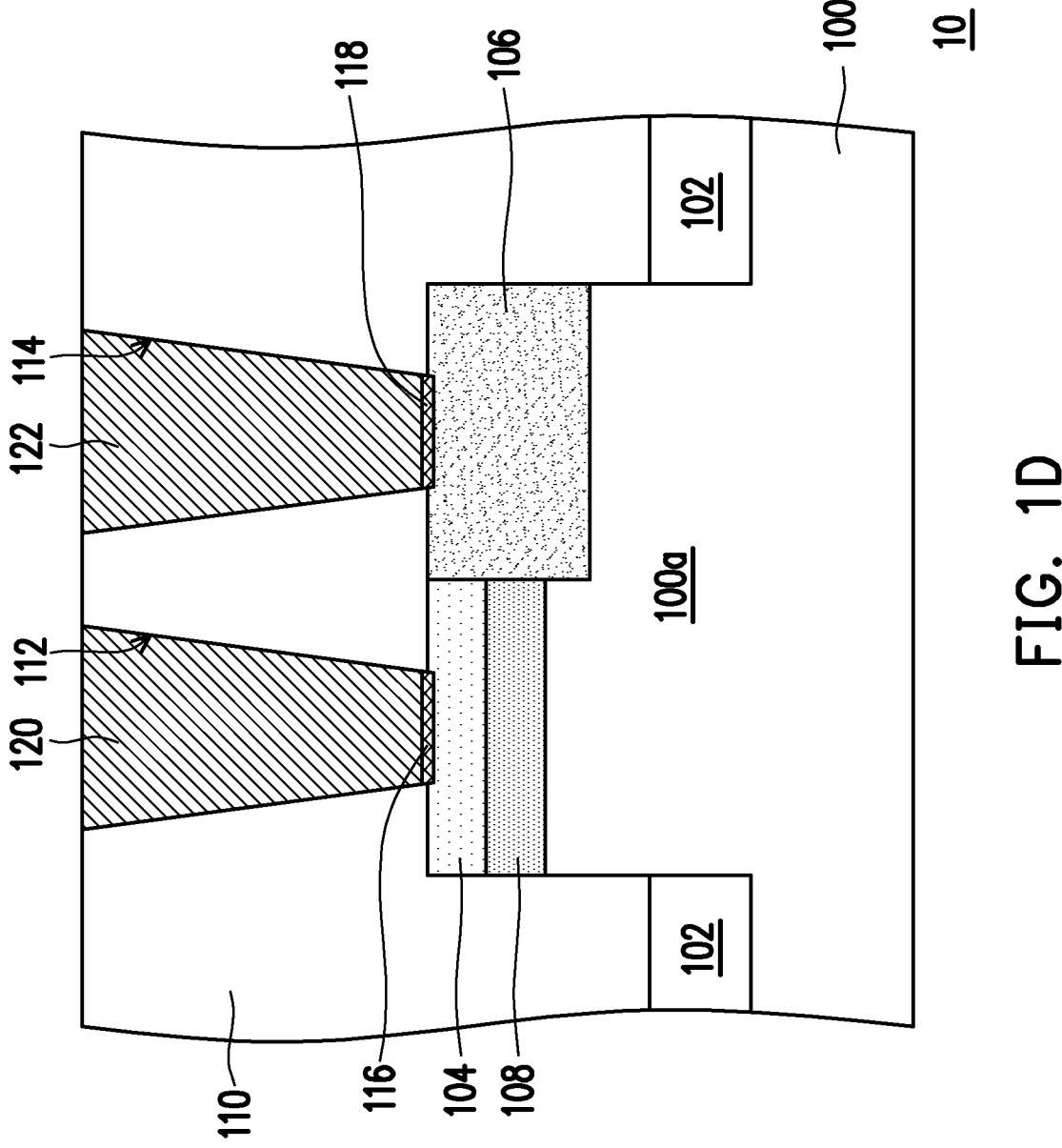

Referring to FIG. 1D, a metal silicide process is performed to form a first metal silicide layer 116 on the first doped region 104 exposed by the first contact hole 112, and to form a second metal silicide layer 118 on the second doped region 106 exposed by the second contact hole 114. In the present embodiment, the first metal silicide layer 116 and the second metal silicide layer 118 have the same material and may be formed in the same process step, but the present invention is not limited thereto. In other embodiments, the first metal silicide layer 116 and the second metal silicide layer 118 may have different materials and may be formed in different process steps.

Then, a conductive material is filled into the first contact hole 112 and the second contact hole 114 to form a first contact 120 on the first metal silicide layer 116 and a second contact 122 on the second metal silicide layer 118. In this way, the semiconductor structure 10 of the present embodiment is formed.

In the semiconductor structure 10, the first doped region 104 and the first metal silicide layer 116 form a Schottky junction, and the second doped region 106 and the second metal silicide layer 118 form an ohmic junction. Therefore, the first doped region 104, the second doped region 106, and the first metal silicide layer 116 and the second metal silicide layer 118 may constitute the Schottky barrier diode of the present embodiment.

In the Schottky barrier diode of the present embodiment, a portion including the first doped region 104 and the first metal silicide layer 116 is served as the anode of the Schottky barrier diode, and a portion including the second doped region 106 and the second metal silicide layer 118 is served as the cathode of the Schottky barrier diode. Therefore, the Schottky barrier diode of the present embodiment is disposed at the fin portion 100a and may have a smaller layout area, which is conducive to the miniaturization requirement of the apparatus.

Furthermore, in the semiconductor structure 10, the first metal silicide layer 116 is located in the first contact hole 112, and the second metal silicide layer 118 is located in the second contact hole 114. Therefore, the first metal silicide layer 116 and the second metal silicide layer 118 may each have a smaller area, and the first metal silicide layer 116 and the second metal silicide layer 118 may be separated from each other without an additional isolation layer. In this way, the distance between the first metal silicide layer 116 and the second metal silicide layer 118 may be effectively reduced, so that the Schottky barrier diode of the present embodiment may have a lower resistance.

In addition, in the semiconductor structure 10, the third doped region 108 with the doping concentration between the doping concentration of the first doped region 104 and the doping concentration of the second doped region 106 is located below the first doped region 104 and connected to the second doped region 106, so the resistance of the Schottky barrier diode may be further reduced.

Figure 2:
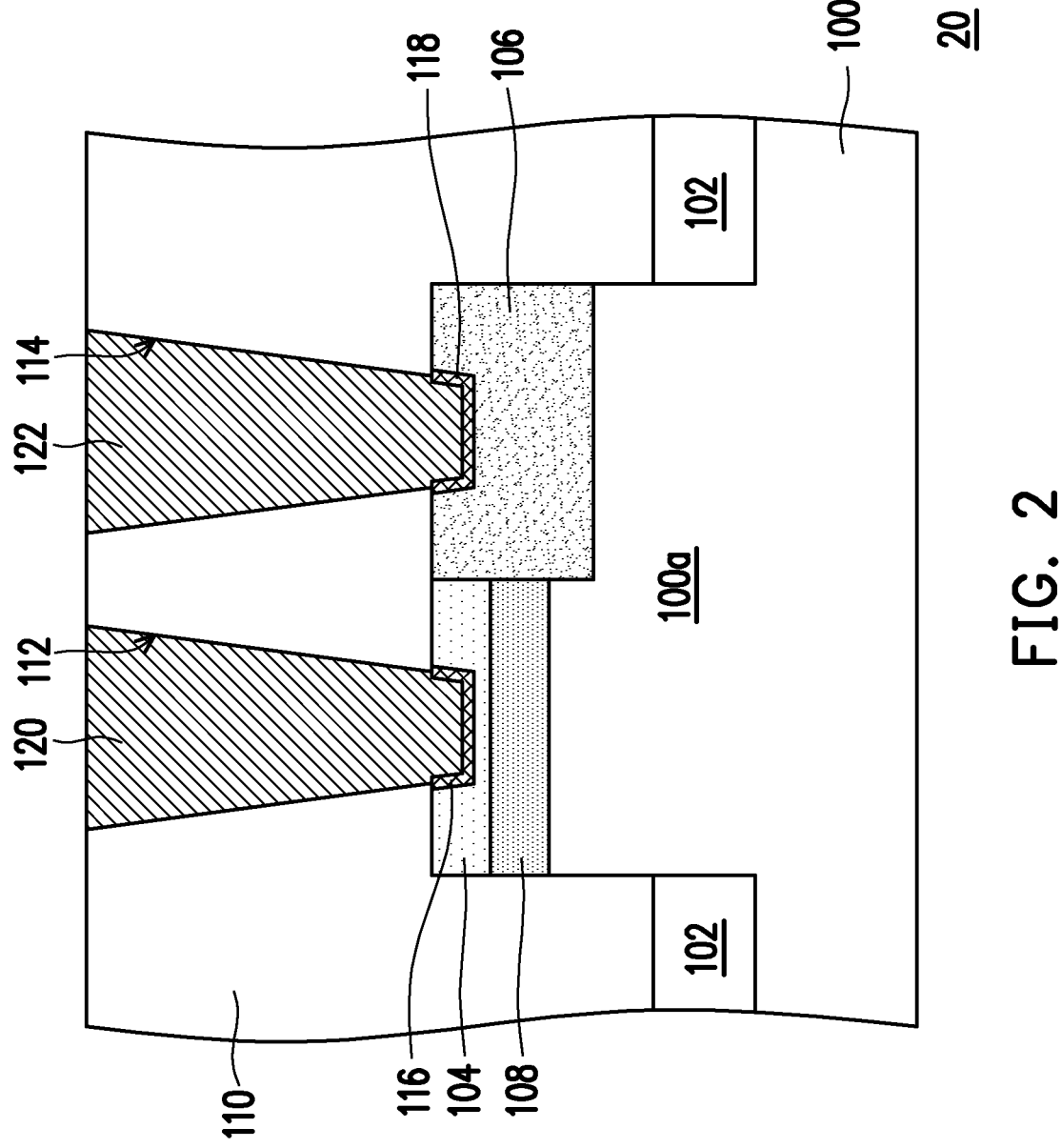
FIG. 2 is a schematic cross-sectional view of the semiconductor structure of the second embodiment of the present invention.

FIG. 2 is a schematic cross-sectional view of the semiconductor structure of the second embodiment of the present invention. In the present embodiment, the device that is the same as that in the first embodiment will be represented by the same reference symbol and will not be described again.

Referring to FIG. 2, in the semiconductor structure 20 of the present embodiment, the first contact 120 extends into the first doped region 104, and the second contact 122 extends into the second doped region 106. That is, in the step described in FIG. 1C, the bottom of the formed first contact hole 112 is located in the first doped region 104 and the bottom of the formed second contact hole 114 is located in the second doped region 106. In this way, after performing the metal silicide process, the first metal silicide layer 116 may be formed at the bottom and a part of the sidewall of the first contact hole 112, and the second metal silicide layer 118 may be formed at the bottom and a part of the sidewall of the second contact hole 114. Therefore, there may be a larger contact area between the first metal silicide layer 116 and the first doped region 104, and a Schottky junction with a larger area may be formed, thereby improving the performance of the Schottky barrier diode.

FIGS. 3A to 3D are schematic cross-sectional views of the manufacturing process of the semiconductor structure of the third embodiment of the present invention. In the present embodiment, the device that is the same as that in the first embodiment will be represented by the same reference symbol and will not be described again.

Figure 3A:
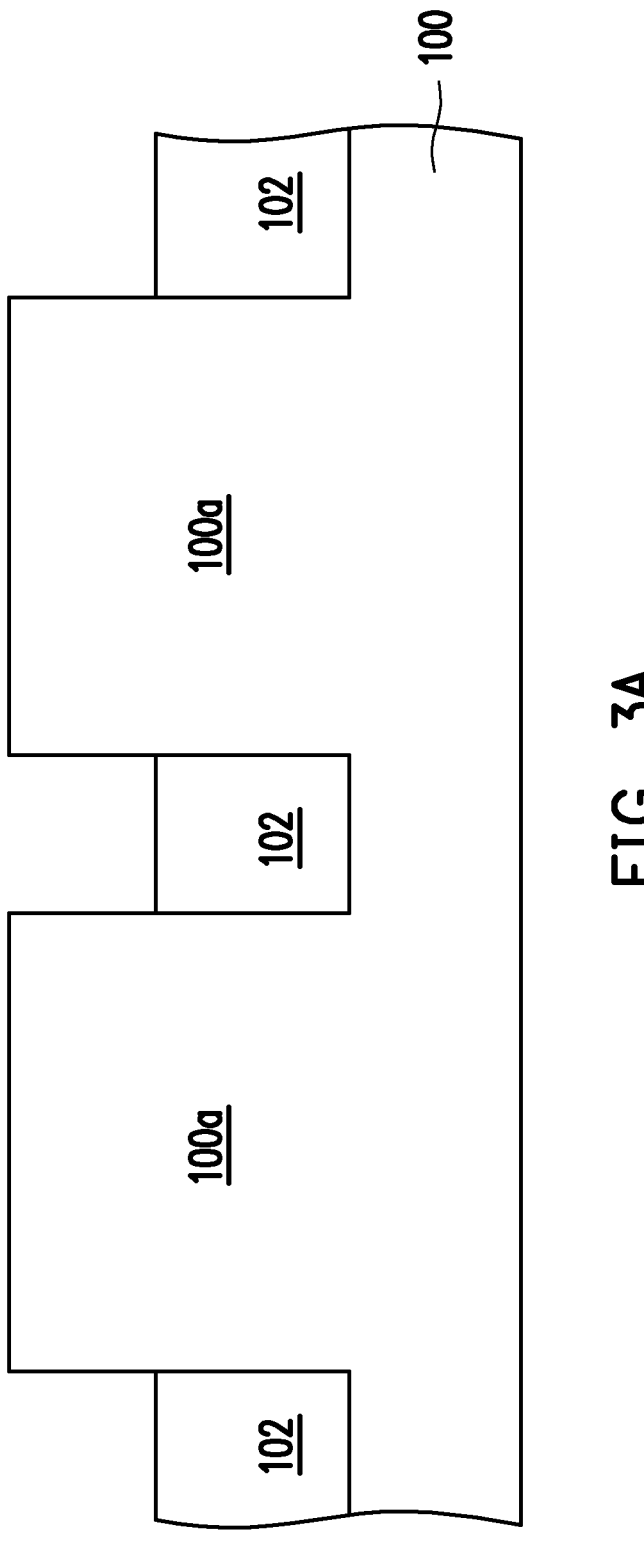
FIGS. 3A to 3D are schematic cross-sectional views of the manufacturing process of the semiconductor structure of the third embodiment of the present invention.

Referring to FIG. 3A, the substrate 100 is provided. In the present embodiment, the substrate 100 includes a plurality of fin portions 100a. Then, the isolation layer 102 is formed on the substrate 100. The isolation layer 102 is located between two adjacent fin portions 100a to surround each fin portion 100a, and the top surface of the isolation layer 102 is lower than the top surface of the fin portion 100a.

Figure 3B:
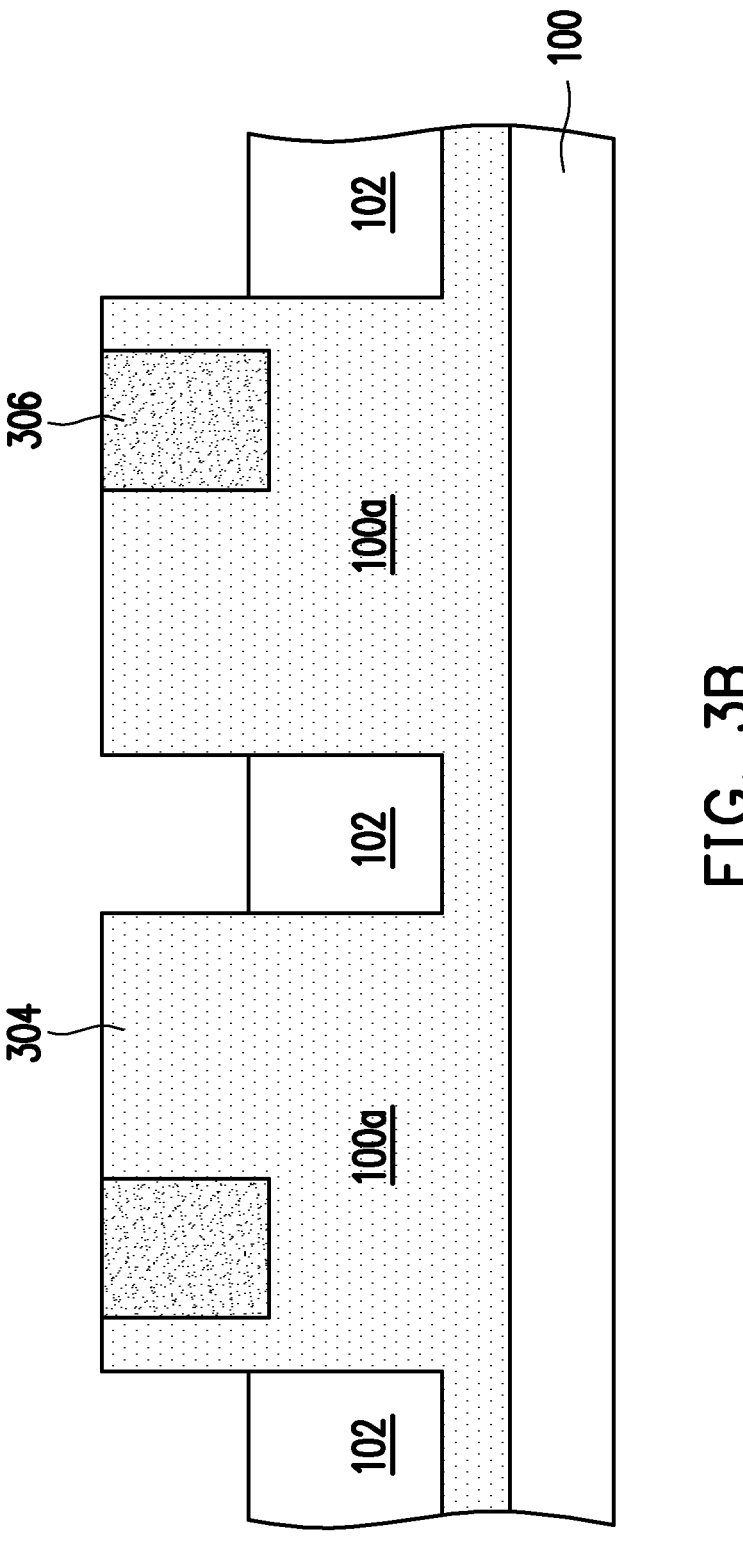

Referring to FIG. 3B, an ion implantation process is performed to form a first doped region 304 and a second doped region 306 in the fin portion 100a. In the present embodiment, the first doped region 304 and the second doped region 306 are N-type doped regions. The first doped region 304 is formed throughout the fin portion 100a and the underlying portion of the substrate 100, and the second doped region 306 is formed in the first doped region 304. In other embodiments, the first doped region 304 may be formed only throughout the fin portion 100a and not be formed in the underlying portion of the substrate 100. The doping concentration of the second doped region 306 is greater than the doping concentration of the first doped region 304. In the present embodiment, the doping concentration of the first doped region 304 may be ranged from $1 \times 10^{18}$ cm$^{-3}$ to $1 \times 10^{19}$ cm$^{-3}$, and the doping concentration of the second doped region 306 can range from $1 \times 10^{20}$ cm$^{-3}$ to $5 \times 10^{20}$ cm$^{-3}$.

Figure 3C:
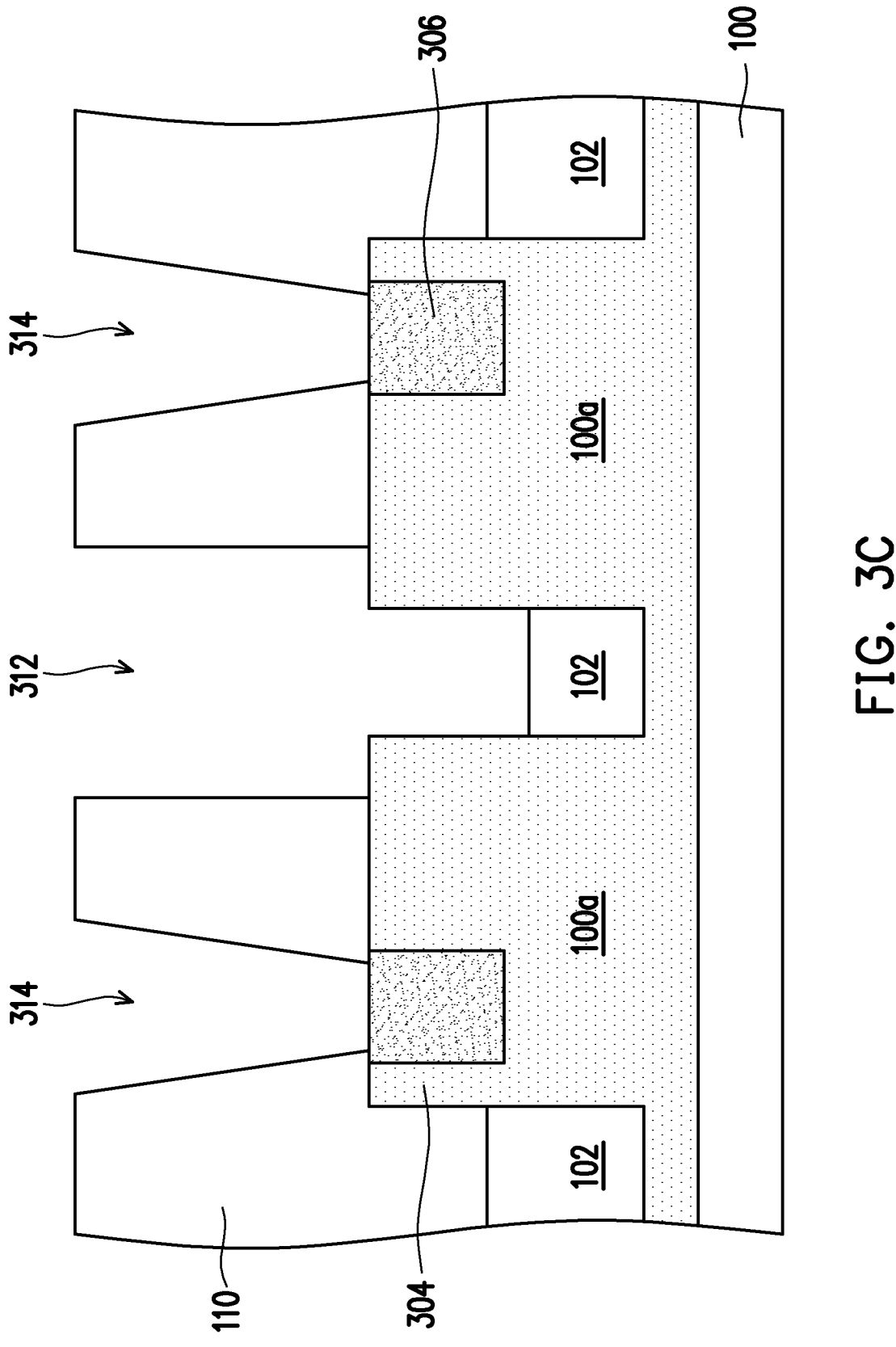

Referring to FIG. 3C, the dielectric layer 110 is formed on the substrate 100. The dielectric layer 110 covers the fin portions 100a and the isolation layer 102. Next, a first contact hole 312 exposing a part of the top surface and a part of the sidewall of the fin portion 100a and second contact holes 314 exposing a part of the second doped region 306 are formed in the dielectric layer 110.

In detail, in the present embodiment, the first contact hole 312 is located between two adjacent fin portions 100a. Therefore, in addition to exposing a part of the top surface and a part of the sidewall at one side of each of the two adjacent fin portions 100a, the first contact hole 312 also exposes the top surface of the isolation layer 102 between the two adjacent fin portions 100a Therefore, in the present embodiment, the width of the portion of the first contact hole 312 located on the fin portion 100a is greater than the width of the portion of the first contact hole 312 located between the two adjacent fin portions 100a.

In addition, in the present embodiment, during forming the first contact hole 312, in addition to removing a part of the dielectric layer 110, a part of the isolation layer 102 between the two adjacent fin portions 100a is further removed, so that the isolation layer 102 between the two adjacent fin portions 100a has a smaller thickness. In other words, the depth of the first contact hole 312 may be adjusted by controlling the degree of removal of the isolation layer 102. In other embodiments, the isolation layer 102 may not be removed during forming the first contact hole 312.

Figure 3D:
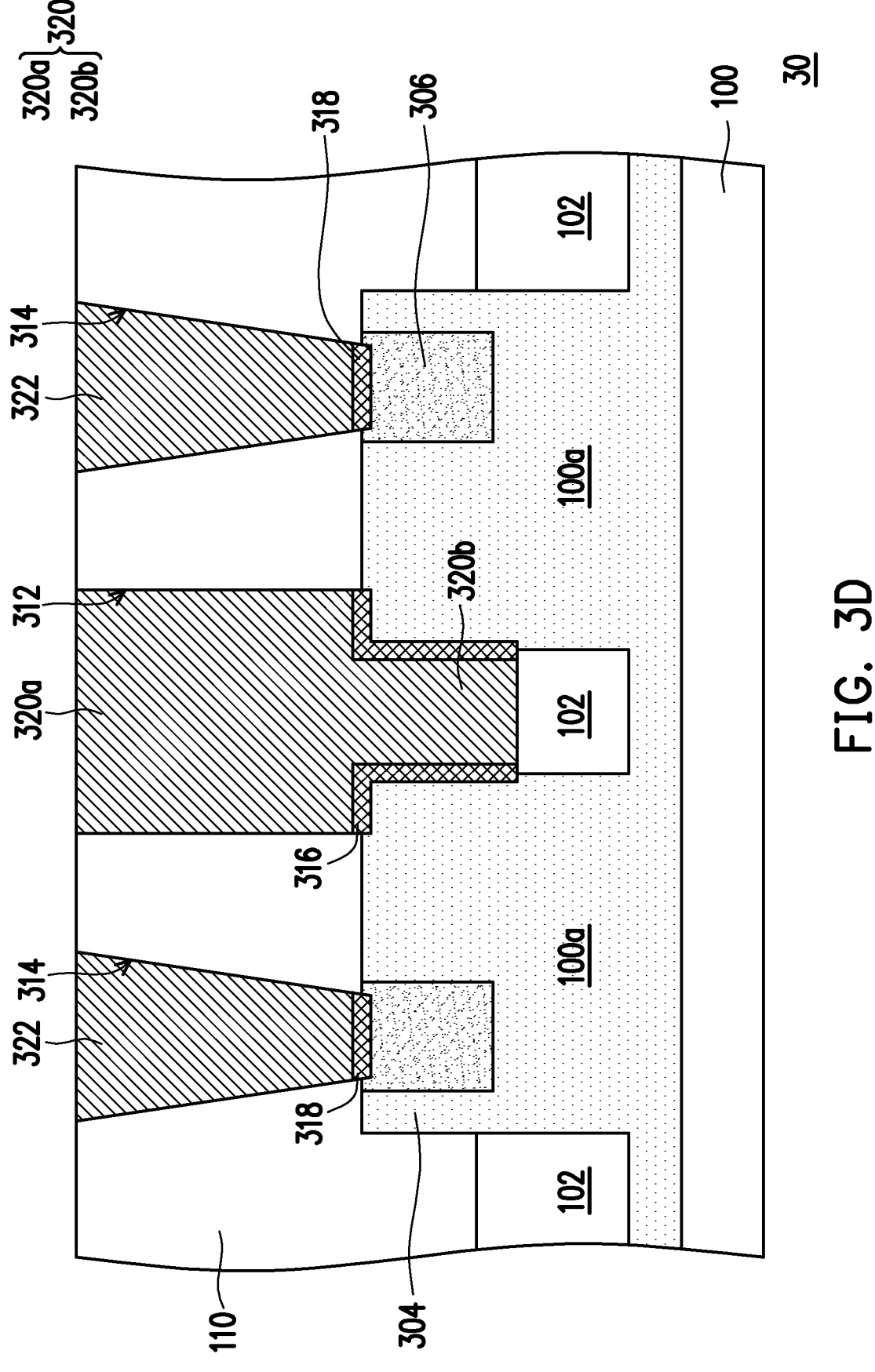

Referring to FIG. 3D, a metal silicide process is performed to form a first metal silicide layer 316 on the first doped regions 104 exposed by the first contact hole 312, and to form a second metal silicide layer 318 on the second doped regions 306 exposed by the second contact holes 314. In the present embodiment, since the first contact hole 312 exposes a part of the top surface and a part of the sidewall of the fin portion 100a, the first metal silicide layer 316 may be formed at the sidewall of the fin portion 100a in addition to the top surface of the fin portion 100a.

Then, a conductive material is filled into the first contact hole 312 and the second contact holes 314 to form a first contact 320 in the first contact hole 312 and second contacts 322 in the second contact holes 314. In this way, the semiconductor structure 30 of the present embodiment is formed.

In the present embodiment, since the first contact hole 312 extends between two adjacent fin portions 100a, the first contact 320 formed includes a first portion 320a and a second portion 320b connected to each other. The first portion 320a is located on the top surface of the fin portion 100a, and the second portion 320b extends downward along the sidewall of the fin portion 100a to the top surface of the isolation layer 102. The width of the first portion 320a is greater than the width of the second portion 320b.

In the semiconductor structure 30, the first doped region 304 and the first metal silicide layer 316 form a Schottky junction, and the second doped region 306 and the second metal silicide layer 318 form an ohmic junction. Therefore, the first doped region 304, the second doped region 306, the first metal silicide layer 316 and the second metal silicide layer 318 may constitute the Schottky energy barrier diode of the present embodiment. The Schottky barrier diode of the present embodiment is disposed at the fin portion 100a, so the Schottky barrier diode may have a smaller layout area, which is conducive to the miniaturization requirements of the apparatus.

In addition, in the semiconductor structure 30, the first metal silicide layer 316 is formed at the top surface and the sidewall of the fin portion 100a, so that there may be a larger contact area between the first metal silicide layer 316 and the first doped region 304, and a Schottky junction with a larger area may be formed, thereby improving the performance of the Schottky barrier diode.

Furthermore, in the semiconductor structure 30, the first metal silicide layer 316 is located in the first contact hole 312, and the second metal silicide layer 318 is located in the second contact hole 314, so the first metal silicide layer 316 and the second metal silicide layer 318 may be separated from each other without an additional isolation layer. In this way, the distance between the first metal silicide layer 316 and the second metal silicide layer 318 may be effectively reduced, so that the Schottky barrier diode of the present embodiment may have a lower resistance.

It will be apparent to those skilled in the art that various modifications and variations may be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor structure, comprising:

a substrate, including a fin portion protruding from a surface of the substrate;

a first doped region having a first conductive type, disposed in the fin portion;

a second doped region having the first conductive type, disposed in the fin portion and connected to the first doped region, wherein a doping concentration of the second doped region is greater than a doping concentration of the first doped region;

a first contact, disposed on the first doped region;

a second contact, disposed on the second doped region;

a first metal silicide layer, disposed between the first contact and the first doped region and only located at a surface of the first doped region; and a second metal silicide layer, disposed between the second contact and the second doped region and only located at a surface of the second doped region.

2. The semiconductor structure of claim 1, wherein the doping concentration of the first doped region is ranged from $1\times10^{18}$ cm$^{-3}$ to $1\times10^{19}$ cm$^{-3}$.

3. The semiconductor structure of claim 1, wherein the doping concentration of the second doped region is ranged from $1\times10^{20}$ cm$^{-3}$ and $5\times10^{20}$ cm$^{-3}$.

4. The semiconductor structure of claim 1, wherein the fin portion has a second conductive type.

5. The semiconductor structure of claim 4, further comprising a third doped region having the first conductive type, disposed below the first doped region, wherein a doping concentration of the third doped region is between the doping concentration of the first doped region and the doping concentration of the second doped region.

6. The semiconductor structure of claim 5, wherein the doping concentration of the third doped region is ranged from $1\times10^{19}$ cm$^{-3}$ and $1\times10^{20}$ cm$^{-3}$.

7. The semiconductor structure of claim 5, wherein a depth of the third doped region is smaller than a depth of the second doped region.

8. The semiconductor structure of claim 1, wherein the first contact extends into the first doped region.

9. The semiconductor structure of claim 1, wherein the first doped region is located throughout the fin portion, and the second doped region is located in the first doped region.

10. The semiconductor structure of claim 9, wherein the first contact comprises a first portion and a second portion connected to each other, the first portion is located on a top surface of the fin portion, the second portion extends downward along a sidewall of the fin portion, and the first metal silicide layer is located between the first contact and the top surface and the sidewall of the fin portion.

11. A manufacturing method of a semiconductor structure, comprising:

providing a substrate comprising a fin portion protruding from a surface of the substrate;

forming a first doped region having a first conductive type in the fin portion;

forming a second doped region having the first conductive type in the fin portion, wherein the second doped region is connected to the first doped region, and a doping concentration of the second doped region is greater than a doping concentration of the first doped region;

forming a first contact on the first doped region;

form a second contact on the second doped region;

forming a first metal silicide layer between the first contact and the first doped region; and forming a second metal silicide layer between the second contact and the second doped region, wherein the first metal silicide layer is only located at a surface of the first doped region, and the second metal silicide layer is only located at a surface of the second doped region.

12. The manufacturing method of claim 11, wherein the doping concentration of the first doped region is ranged from $1\times10^{18}$ cm$^{-3}$ to $1\times10^{19}$ cm$^{-3}$.

13. The manufacturing method of claim 11, wherein the doping concentration of the second doped region is ranged from $1\times10^{20}$ cm$^{-3}$ to $5\times10^{20}$ cm$^{-3}$.

14. The manufacturing method of claim 11, wherein the fin portion has a second conductive type.

15. The manufacturing method of claim 14, further comprising forming a third doped region having the first conductive type below the first doped region, wherein a doping concentration of the third doped region is between the doping concentration of the first doped region and the doping concentration of the second doped region.

16. The manufacturing method of claim 15, wherein the doping concentration of the third doped region is ranged from $1\times10^{19}$ cm$^{-3}$ to $1\times10^{20}$ cm$^{-3}$.

17. The manufacturing method of claim 15, wherein a depth of the third doped region is smaller than a depth of the second doped region.

18. The manufacturing method of claim 11, wherein the first contact extends into the first doped region.

19. The manufacturing method of claim 11, wherein a forming method of the first contact, the second contact, the first metal silicide layer and the second metal silicide layer comprises:

forming a dielectric layer on the substrate, wherein the dielectric layer covers the fin portion;

forming a first contact hole exposing a part of the first doped region in the dielectric layer;

forming a second contact hole exposing a part of the second doped region in the dielectric layer;

forming the first metal silicide layer on the first doped region exposed by the first contact hole;

forming the second metal silicide layer on the second doped region exposed by the second contact hole; and forming a conductive material on the first metal silicide layer and the second metal silicide layer.

20. The manufacturing method of claim 11, wherein the first doped region is formed throughout the fin portion, and the second doped region is formed in the first doped region.

21. The manufacturing method of claim 20, wherein the first contact comprises a first portion and a second portion connected to each other, the first portion is located on a top surface of the fin portion, the second portion extends downward along a sidewall of the fin portion, and the first metal silicide layer is formed between the first contact and the top surface and the sidewall of the fin portion.

22. The manufacturing method of claim 21, wherein a forming method of the first contact, the second contact, the first metal silicide layer and the second metal silicide layer comprises:

forming a dielectric layer on the substrate, wherein the dielectric layer covers the fin portion;

forming a first contact hole exposing a part of the top surface and a part of the sidewall of the fin portion in the dielectric layer;

forming a second contact hole exposing a part of the second doped region in the dielectric layer;

forming the first metal silicide layer on the fin portion
exposed by the first contact hole;

forming the second metal silicide layer on the second
doped region exposed by the second contact hole; and forming a conductive material on the first metal silicide 5
layer and the second metal silicide layer.

\* \* \* \* \*